United States Patent
Luo (10) Patent No.: US 10,784,323 B2
(45) Date of Patent: Sep. 22, 2020

(54) DISPLAY PANEL, METHOD FOR PRODUCING THE SAME AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/408,164

(22) Filed: May 9, 2019

(65) Prior Publication Data
US 2020/0098838 A1 Mar. 26, 2020

(30) Foreign Application Priority Data
Sep. 26, 2018 (CN) .......................... 2018 1 1123759

(51) Int. Cl.
*H01L 27/32* (2006.01)
*G02B 5/00* (2006.01)
*H01L 27/12* (2006.01)
*H01L 51/52* (2006.01)

(52) U.S. Cl.
CPC .......... *H01L 27/3246* (2013.01); *G02B 5/003* (2013.01); *H01L 27/1218* (2013.01); *H01L 51/5237* (2013.01)

(58) Field of Classification Search
CPC ........ H01L 27/32–3297; H01L 51/5237–5259
See application file for complete search history.

(56) References Cited

U.S. PATENT DOCUMENTS

| 9,897,829 B2* | 2/2018 | Jiang ..................... G02F 1/1303 |
|---|---|---|
| 10,634,966 B2* | 4/2020 | Ni ..................... G02F 1/136209 |
| 2008/0042558 A1* | 2/2008 | Buchhauser ........ H01L 27/3225 313/504 |
| 2009/0021157 A1* | 1/2009 | Kim ..................... H01L 51/5284 313/504 |
| 2019/0131568 A1* | 5/2019 | Li ......................... H01L 51/5237 |
| 2019/0318696 A1* | 10/2019 | Imai ..................... G09G 3/3607 |

* cited by examiner

Primary Examiner — Gene W Lee
(74) Attorney, Agent, or Firm — Kinney & Lange, P.A.

(57) ABSTRACT

A display panel, a method for producing the same, and a display device are disclosed. The display panel has: a base substrate; a thin film transistor array, which is on a surface of the base substrate; a UV light shielding layer, which is on a side of the thin film transistor array away from the base substrate; a pixel definition layer, which is on a side of the UV light shielding layer away from the base substrate; a thin film encapsulation layer, which is on a side of the pixel definition layer away from the base substrate, wherein the pixel definition layer has a light conversion material, which emits UV light by excitation of infrared light, and the thin film encapsulation layer has a UV-cured material.

14 Claims, 3 Drawing Sheets

DISPLAY PANEL, METHOD FOR PRODUCING THE SAME AND DISPLAY DEVICE

CROSS-REFERENCE TO RELATED APPLICATION

This application claims the priority of Chinese Patent Application No. 201811123759.3 filed on Sep. 26, 2018, which is incorporated herein in its entirety by reference.

TECHNICAL FIELD

This disclosure relates to the technical field of display, in particular, to a display panel, a method for producing the same, and a display device.

BACKGROUND

In recent years, OLEDs gradually developed in the technical fields of display and illumination, in particular in the technical field of display. Since OLEDs exhibit advantages such as high response, high contrast and flexibility, there a prospect of being broadly used. However, since corrosion and damage will occur in an OLED device by the effect of moisture and oxygen, it is very important to selecting a better encapsulation method for an OLED device. Currently, thin film encapsulation is an encapsulation method widely used in production of OLED display panels. This encapsulation method still has disadvantages that limit the popularization of OLED display panels.

Therefore, current display panels still need to be improved.

SUMMARY

In an aspect of this disclosure, this disclosure provides a display panel, comprising:
a base substrate;
a thin film transistor array, which is on a surface of the base substrate;
a UV light shielding layer, which is on a side of the thin film transistor array away from the base substrate;
a pixel definition layer, which is on a side of the UV light shielding layer away from the base substrate;
a thin film encapsulation layer, which is on a side of the pixel definition layer away from the base substrate,
wherein the pixel definition layer comprises a light conversion material, which emits UV light by excitation of infrared light, and the thin film encapsulation layer comprises a UV-cured material.

According to an embodiment of this disclosure, material forming the UV light shielding layer comprises at least one of zinc oxide, zinc sulfide and titanium dioxide.

According to an embodiment of this disclosure, the UV light shielding layer has a thickness of 0.03 to 0.5 μm.

According to an embodiment of this disclosure, the display panel further comprises:
a plurality of pixels defined by the pixel definition layer;
wherein the UV light shielding layer is between pixel electrodes on a side of the plurality of pixels close to the base substrate.

According to an embodiment of this disclosure, an orthogonal projection of the UV light shielding layer on the base substrate covers an orthogonal projection of the pixel definition layer on the base substrate.

According to an embodiment of this disclosure, the light conversion material comprises at least one of an oxide doped with rare-earth ions, a fluoride doped with rare-earth ions, an oxyfluoride doped with rare-earth ions, a sulfide doped with rare-earth ions and a halide doped with rare-earth ions.

According to an embodiment of this disclosure, the light conversion material comprises at least one of $\beta$-NaYF4:$Yb^{3+}$,$Tm^{3+}$/CdSe, $\beta$-NaYF4:$Ln^{3+}$ and $\beta$-NaYF4:$Yb^{3+}$,$Er^{3+}$.

According to an embodiment of this disclosure, the light conversion material is a particle.

According to an embodiment of this disclosure, the particle has a particle size of 5 to 20 nm.

According to an embodiment of this disclosure, an amount of the light conversion material in the pixel definition layer is 5 to 30 wt. %.

In another aspect of this disclosure, this disclosure provides a method for producing the display panel mentioned above. The method comprises:
forming the thin film transistor array on a surface of the base substrate;
forming the UV light shielding layer on a side of the thin film transistor array away from the base substrate;
forming the pixel definition layer on a side of the UV light shielding layer away from the base substrate;
forming a layer of UV-curable material on a side of the pixel definition layer away from the base substrate;
irradiating the pixel definition layer with infrared light, so that the light conversion material in the pixel definition layer emits UV light, which irradiates and cures the layer of UV-curable material, to form the UV-cured material in the thin film encapsulation layer.

According to an embodiment of this disclosure, the forming the pixel definition layer comprises:
forming a solution comprising the light conversion material;
applying the solution on a surface of the UV light shielding layer away from the base substrate, and performing drying and patterning treatments, to obtain the pixel definition layer.

According to an embodiment of this disclosure, a process for forming the UV light shielding layer comprising at least one of sputtering, printing, spray coating and atom layer deposition.

In another aspect of this disclosure, this disclosure provides a display device comprising the display panel mentioned above.

DETAILED DESCRIPTION

A purpose of this disclosure is to propose a display panel, which has a simple structure, is easy to be produced, has low costs, or may be encapsulated without damaging the thin film transistor.

The inventor found that the display panel of this disclosure has a simple structure, is easy to be produced, and may be encapsulated without using UV light to irradiate the display panel, which prevent the damage to the active layer (in particular, the oxide semiconductor in the thin film transistor) by direct irradiation with UV light. Furthermore, under excitation by infrared light, the pixel definition layer comprising the light conversion material may emit light as a point light source, which may control the range of the irradiation by UV light. The amount of the light to the thin film transistor by scattering and transmitting is less, and the luminous flux is less. This greatly restricts the exposure on the thin film transistor, and reduces the damage to the thin film transistor. Thus, the problem of excursion of the electron mobility of the thin film transistor is less prevalent. The yield of the product will be increased, the costs will be reduced, and the test element group (TEG) zone around the display panel will not be easily damaged by irradiation with infrared light, which further increases the yield of the product.

The inventor found that the method for producing the display panel in this disclosure is simple and convenient to be operated, has relatively low costs, and is suitable for industrial production. Further, the produced display panel has all characteristics and advantages mentioned above.

The inventor found that the display device of this disclosure has a simple structure, is easy to be produced, has low costs, has a high yield, and exhibits relatively high display quality.

Examples of this disclosure will be described below. The examples described below are illustrative, are only used for explaining this disclosure, and cannot be understood as restriction to this disclosure. If no specific technique or condition is mentioned in an example, the example was performed by technique or condition described in the documents in the art or performed according to the specifications of products. If the producer of a reagent or apparatus is not mentioned, the reagent or apparatus was a conventional product available in the market.

This disclosure is done by the inventor's consideration and discovery below.

Figure 1:
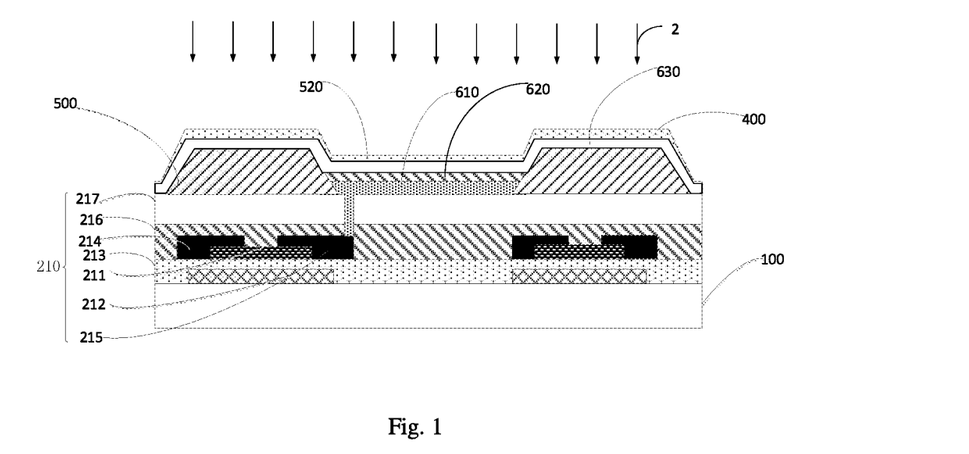
FIG. 1 is a schematic drawing of curing a thin film encapsulation layer in a display panel by irradiating the display panel with UV light in the related art.

Currently, the method for encapsulating a display panel is typically covering an OLED device with a thin film encapsulation structure made by stacking an inorganic layer and an organic layer, to block the moisture and oxygen, wherein the moisture and oxygen are blocked by using the inorganic layer, and the organic layer serves for functions such as releasing the stress and planarization. Currently, production of the organic layer typically uses the ink jet printing process, wherein an organic monomer in a liquid form is printed on a surface of an inorganic encapsulation layer and becomes a solid polymer in a chain form by irradiation with ultraviolet (UV) light. However, during production of an OLED display panel with a large size, the irradiation with UV light 2 influences the thin film transistor 210 (TFT) (in particular, the oxide semiconductor in the TFT, for example, the active layer 211, etc.), referring to FIG. 1. It results in excursion of the electron mobility thereof and the deterioration of the performance thereof. Therefore, it is necessary to shield the weak position by a mask. However, the costs of a mask are high. Once the pattern of a mask is changed, a mask must be remade, which increases the costs greatly. The inventor intensively studied the above-mentioned technical problem. After study, the inventor found that a light conversion material that may absorb infrared light and emit UV light may be added into the pixel definition layer, so that the damage to the thin film transistor by direct irradiation with UV light may be prevented by irradiating the thin film encapsulation structure with infrared light, and found that a UV light shielding layer produced between the thin film transistor array and the pixel definition layer prevents the UV light emitted by the light conversion material from irradiating the TFT when encapsulation. Further, the damage to the TFT (in particular, the oxide semiconductor in the TFT) by the UV light is greatly reduced, the yield of the product is increased, and no UV-mask with high costs is needed, so as to reduce the production costs.

Figure 2:
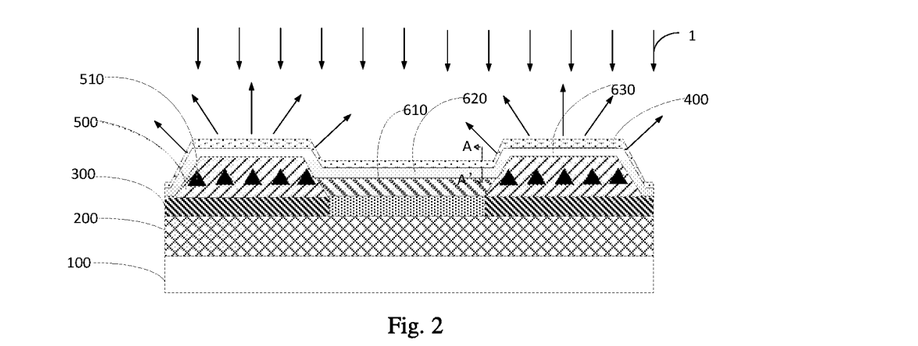
FIG. 2 is a schematic drawing of curing a thin film encapsulation layer in a display panel by irradiating the display panel with infrared light in an embodiment of this disclosure.

In view of above, in an aspect of this disclosure, this disclosure provides a display panel. According to an embodiment of this disclosure, referring to FIG. 2, the display panel comprises: a base substrate 100; a thin film transistor array 200, which is on a surface of the base substrate 100; a UV light shielding layer 300, which is on a side of the thin film transistor array away from the base substrate 100; a pixel definition layer 500, which is on a side of the UV light shielding layer away from the base substrate 100; a thin film encapsulation layer 500, which is on a side of the pixel definition layer away from the base substrate 100, wherein the pixel definition layer 500 comprises a light conversion material 510, which emits UV light by excitation of infrared light, and the thin film encapsulation layer 400 comprises a UV-cured material. The inventor found that the display panel has a simple structure, is easy to be produced, and may be encapsulated without using UV light to irradiate the display panel, which prevent the damage to the active layer (in particular, the oxide semiconductor in the thin film transistor) by direct irradiation with UV light. Furthermore, under excitation by infrared light 1 (referring to FIG. 2), the pixel definition layer comprising the light conversion material may emit light as a point light source (referring to FIG. 2), which may control the range of the irradiation by UV light. The amount of the light to the thin film transistor by scattering and transmitting is less, and the luminous flux is less. This greatly restricts the exposure on the thin film transistor, reduces the damage to the thin film transistor. Thus, it is hardly to result in the problem of excursion of the electron mobility of the thin film transistor. The yield of the product will be increased, the costs will be reduced, and the test element group (TEG) zone around the display panel will hardly be damaged by irradiation with infrared light, which further increases the yield of the product.

According to an embodiment of this disclosure, the light conversion material comprises at least one of an oxide doped with rare-earth ions, a fluoride doped with rare-earth ions, an oxyfluoride doped with rare-earth ions, a sulfide doped with rare-earth ions and a halide doped with rare-earth ions. Thus, there are many sources for the material. By using such material, UV light may be emitted effectively by excitation by infrared light, the efficiency of absorbing infrared light is relatively high, and the utilization factor of energy is relatively high. According to an embodiment of this disclosure, materials forming the rare-earth ions include at least one of ions of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc) and yttrium (Y). Therefore, there are many sources for the material, and the performance in use is better.

In some embodiments of this disclosure, the light conversion material includes at least one of $\beta$-NaYF4:Yb$^{3+}$, Tm$^{3+}$/CdSe, $\beta$-NaYF4:Ln$^{3+}$ and $\beta$-NaYF4:Yb$^{3+}$,Er$^{3+}$. Thus, the particles mentioned above may emit UV light more efficiently by excitation by infrared light, and has a higher efficiency of absorbing infrared light and a higher utilization factor of energy.

According to an embodiment of this disclosure, the light conversion material is a particle. Thus, particles are prone to relatively uniform dispersion in the pixel definition layer. The particles may also emit light as point light sources, so that the effect of curing the thin film encapsulation layer is better. According to an embodiment of this disclosure, the amount of the light conversion material in the pixel definition layer is 5 to 30 wt. % (for example, 5 wt %, 10 wt %, 15 wt %, 20 wt %, 25 wt %, 30 wt %, or the like), on the basis of the total mass of the pixel definition layer. Thus, when the amount of the light conversion material is in the above-mentioned range, the UV light emitted by it after it absorbs infrared light may curing the organic encapsulation layer effectively, the effect of the encapsulation is better, and the active layer is hardly to be damaged. With respect to the above-mentioned range of amount, when the amount of the light conversion material is too low, the effect of curing the organic encapsulation layer by the UV light emitted by it after it absorbs infrared light is relatively poor; and when the amount of the light conversion material is too high, the effect of curing the organic encapsulation layer is better, but the dispersion of the light conversion material in the pixel definition layer is relatively not uniform, which makes the performance of the pixel definition layer is relatively poor.

According to an embodiment of this disclosure, pixel definition layer has a thickness of 1 to 2 μm (for example, 1 μm, 1.2 μm, 1.4 μm, 1.6 μm, 1.8 μm, 2 μm, or the like). Thus, the above-mentioned pixel definition layer may comprises a proper amount of the light conversion material, so that an effect of better encapsulation is achieved while the active layer in the thin film transistor is hardly to be damaged.

According to an embodiment of this disclosure, the particle has a particle size of 5 to 20 nm. (for example, 5 nm, 10 nm, 15 nm, 20 nm, or the like). Thus, the particles are dispersed in the pixel definition layer relatively uniformly, and may absorb infrared light and emit UV light effectively. When the particle size of the particles is too small, the efficiency of absorbing infrared light and emit UV light is relatively low. When the particle size of the particles is too large, the effect of dispersion in the pixel definition layer is relatively poor, which is relatively disadvantageous for improving the yield.

According to an embodiment of this disclosure, material forming the UV light shielding layer comprises at least one of zinc oxide, zinc sulfide and titanium dioxide. Thus, there are many sources for the material, the effect of absorbing UV light is better. Therefore, the transmittance of the UV light may be greatly reduced, and thus the exposure of the active layer of the thin film transistor may be reduced, and the effect of protecting the active layer of the thin film transistor is better.

According to an embodiment of this disclosure, the UV light shielding layer has a thickness of 0.03 to 0.5 μm (for example, 0.03 μm, 0.05 μm, 0.1 μm, 0.15 μm, 0.2 μm, 0.25 μm, 0.3 μm, 0.35 μm, 0.4 μm, 0.45 μm, 0.5 μm, or the like). Thus, in the above-mentioned range of thickness, the UV light shielding layer has a better effect of absorbing the UV light, may reduce the transmittance of the UV light greatly, reduce the exposure of the active layer of the thin film transistor, and has better effect of protecting the active layer of the thin film transistor. With respect to the above-mentioned range of thickness, when the thickness of the UV light shielding layer is too high, the effect of absorbing the UV light is better, while the thickness of the display panel will be relatively high and the costs will be relatively high; when the thickness of the UV light shielding layer is too low, the effect of absorbing the UV light will be relatively poor, and the effect of protecting the active layer will be relatively poor.

Figure 3:
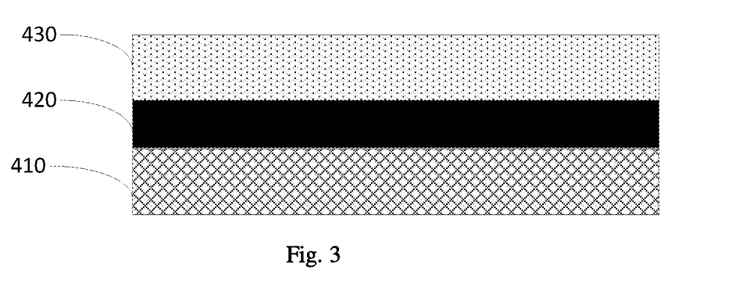
FIG. 3 is a sectional view along the A-A' direction in FIG. 1.

According to an embodiment of this disclosure, the thin film encapsulation layer comprises a UV-cured material. Thus, the effect of encapsulation is achieved by curing the thin film encapsulation layer with UV light. According to an embodiment of this disclosure, referring to FIG. 3, the thin film encapsulation layer may comprises: a first inorganic encapsulation layer 410, an organic encapsulation layer 420 on a surface of the first inorganic encapsulation layer 410 away from the base substrate, a second inorganic encapsulation layer 430 on a surface of the organic encapsulation layer 420 away from the base substrate. Thus, the thin film encapsulation layer has a simple structure.

Thus, thin film encapsulation layer has a simple structure, the effect of blocking moisture and oxygen is better, the stress is less, the surface is relatively flat, and the effect of encapsulation is better. According to an embodiment of this disclosure, in order to further improve the effect of encapsulation of the thin film encapsulation layer, multiple organic encapsulation layers and inorganic encapsulation layers may be arranged alternatively. Thus, the thin film encapsulation layer exhibits better effect of blocking moisture and oxygen.

According to an embodiment of this disclosure, the material for forming the first inorganic encapsulation layer and the material forming the second inorganic encapsulation layer may be the same or may be different. The specific material may be flexibly selected according to practical requirements. In some examples of this disclosure, the material forming the first inorganic encapsulation layer and the material forming the second inorganic encapsulation layer are selected from at least one of SiN$_x$, SiO$_2$, SiC, Al$_2$O$_3$, ZnS, ZnO, respectively. Thus, the above-mentioned material has a better effect of blocking moisture and oxygen, there are many sources for the material, and the costs of the material are relatively low, which are beneficial to reduction of the costs of the display panel.

According to an embodiment of this disclosure, the thickness of the first inorganic encapsulation layer and the thickness of the second inorganic encapsulation layer may be 0.05 μm to 2.5 μm, respectively. Thus, the inorganic encapsulation layer with the above-mentioned thicknesses has a better effect of encapsulation and a better effect of blocking moisture and oxygen.

According to an embodiment of this disclosure, the material forming the organic encapsulation layer may be material curable by irradiation by UV light. For example, material forming the organic encapsulation layer may comprise but is not limited to at least one of polyethylene, polystyrene, polypropylene, polyacrylic acid, polyacrylate, polyamide, polyimide, polycarbonate, polyurethane acrylate, polyester, polysiloxane, and polysilazane. Thus, there are many sources for the material, the effect of releasing the stress of the thin film encapsulation layer is better, and the surface of the thin film encapsulation layer obtained finally is relatively flat. It should be indicated that when the materials forming the organic encapsulation layer comprises at least two of the above-mentioned materials, polymerization may be occur between any two of the materials during the curing. According to an embodiment of this disclosure, the manner for forming the organic encapsulation layer may comprise providing the material forming the organic encapsulation layer on a surface of the first inorganic encapsulation layer away from the base substrate by spray coating, ink jet printing or printing, and then irradiating the pixel definition layer with infrared light, so as to stimulate the light conversion material in the pixel definition layer to emit UV light, which cures the material forming the organic encapsulation layer. The manner of irradiation with infrared light may be irradiating the thin film encapsulation structure from a side of the thin film encapsulation structure away from the base substrate in a direction perpendicular to the base substrate. Thus, the operation is simple and convenient, and the performance of the encapsulation is better.

According to an embodiment of this disclosure, the organic encapsulation layer may have a thickness of 2.5 to 20 μm. Thus, when the thickness of the organic encapsulation layer is in the above-mentioned range, the stress in the thin film encapsulation layer may be effectively released, so that the surface of the thin film encapsulation layer is relatively flat, the film of the organic encapsulation layer is relatively uniform and has a controllable edge.

Figure 4:
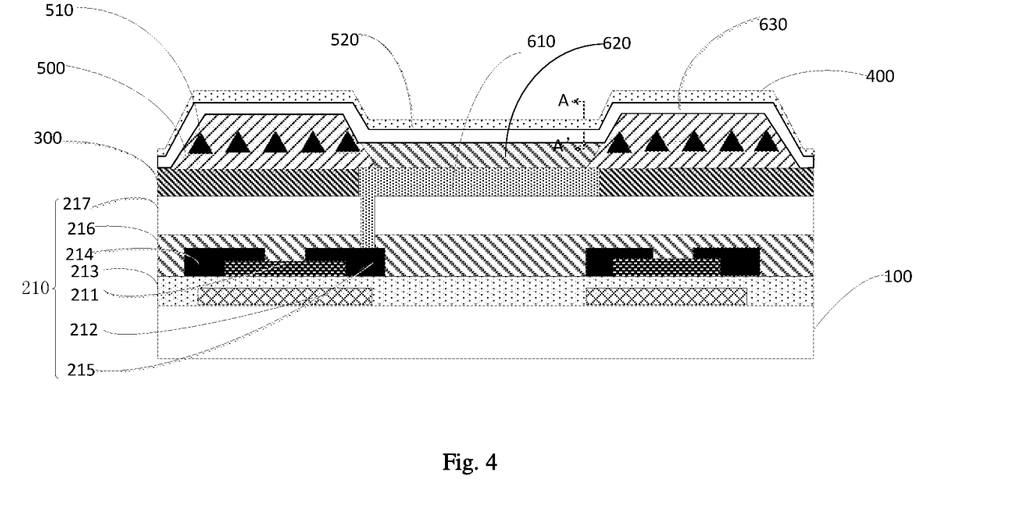
FIG. 4 is a structural schematic drawing of a display panel in another embodiment of this disclosure.

According to an embodiment of this disclosure, referring to FIG. 4, the thin film transistor array comprises a plurality of thin film transistor 210 provided separately. The thin film transistor may be a thin film transistor of the top-gate type or a thin film transistor of the bottom-gate type. Here a thin film transistor of bottom-gate type is used as the example to describe the specific structure of the thin film transistor. Specifically, the thin film transistor 210 comprises: a gate electrode 212 on a surface of a base substrate 100; a gate insulating layer 213 on a surface of the base substrate 100 and covering the gate electrode 212; an active layer 211 on a surface of the gate insulating layer 213 away from the base substrate 100; a source electrode 214 and a drain electrode 215 on a surface of the gate insulating layer 213 away from the base substrate 100 and covering a part of the active layer 211, respectively; an interlayered insulating layer 216 on a surface of the gate insulating layer 213 away from the base substrate 100 and covering the active layer 211, the source electrode 214 and the drain electrode 215; a planarization layer 217 on a surface of the interlayered insulating layer 216 away from the base substrate 100. Thus, the thin film transistor has a simple structure and is easy to be produced.

According to an embodiment of this disclosure, the material forming the above-mentioned gate insulating layer may comprise but is not limited to silica, doped silica, or the like; the material forming the above-mentioned gate electrode, source electrode and drain electrode may comprise but is not limited to metal, conductive metal oxide, or the like; the material forming the above-mentioned interlayered insulating layer may comprise but is not limited to silica, doped silica, or the like; the material forming the above-mentioned planarization layer may comprise but is not limited to polypropylene, or the like; the method forming the planarization layer may comprise but is not limited to spin coating, or the like. Thus, the materials forming the above-mentioned structure are all conventional materials. There are many sources for the materials, and the performance in use is better.

According to an embodiment of this disclosure, display panel further comprises: a plurality of pixels defined by the pixel definition layer; wherein the UV light shielding layer is between pixel electrodes on a side of the plurality of pixels close to the base substrate. Referring to FIG. 4, the display panel further comprises: a pixel electrode, i.e. a first electrode 610 at a side close to the base substrate, wherein the first electrode 610 comprises a portion located in the opening 520 defined by the pixel definition layer 500; a light-emitting layer 620, which is on a surface of the first electrode 610 away from the base substrate 100; second electrode 630, which is a pixel electrode at a side away from the base substrate, wherein the second electrode 630 is on a surface of the light-emitting layer 620 away from the base substrate 100, wherein the UV light shielding layer 300 and the portion of the first electrode 610 located in the opening 520 defined by the pixel definition layer 500 are provided in the same layer. When the UV light shielding layer between the pixel electrodes of a side of the plurality of pixels close to the base substrate, it is beneficial to decrease the thickness of the display panel. It should be indicated that the first electrode is electrically connected to the drain electrode through a via hole. A first electrode in the opening should be understood in a broad sense, as long as a first electrode may be formed in the region corresponding to the opening.

According to an embodiment of this disclosure, an orthogonal projection of the UV light shielding layer on the base substrate covers an orthogonal projection of the pixel definition layer on the base substrate. That is to say, an orthogonal projection of the UV light shielding layer comprises an orthogonal projection of the pixel definition layer. Thus, the effect of the UV light shielding layer shielding the emission of UV light is better, and the effect of protecting the thin film transistor is better.

According to an embodiment of this disclosure, the material forming the first electrode or the second electrode may be comprises but is not limited to aluminum-doped zinc oxide (AZO, antimonyzinc tin oxide (AZTO), tin indium oxide (ITO), fluorine-doped tin dioxide (FTO) or metal (for example, silver), or the like. Thus, there are many sources for the material, and the performance in use is better. According to an embodiment of this disclosure, the first electrode may have a thickness of 70 nm to 150 nm. Thus, the conductivity of the first electrode is better.

According to an embodiment of this disclosure, the material forming the light-emitting layer comprises organic luminescent material or quantum dot material. Thus, there are many sources for the material of the light-emitting layer, and the effect of luminescence of the electroluminescent device is better. According to an embodiment of this disclosure, the organic luminescent material may comprise but is not limited to PPV-based (poly-p-styrene) polymer, fluorene-based luminescent polymer, polythiophene-based polymer, and the like; and the quantum dot material may comprise but is not limited to one-element quantum dot (for example, including but not limited to carbon quantum dot, silicon quantum dot, or the like), two-elements quantum dot (for example, including but not limited to ZnO, $SiO_2$, CdS, PbS, or the like), two-elements quantum dot (for example, including but not limited to $CdSe_xTe_{1-x}$, $CuInS_2$), and the like. Thus, there are many sources for the light-emitting layer, and the produced electroluminescent device has a higher luminescence efficiency.

According to an embodiment of this disclosure, the material forming the base substrate may comprise but is not limited to glass, resin, or the like.

Figure 5:
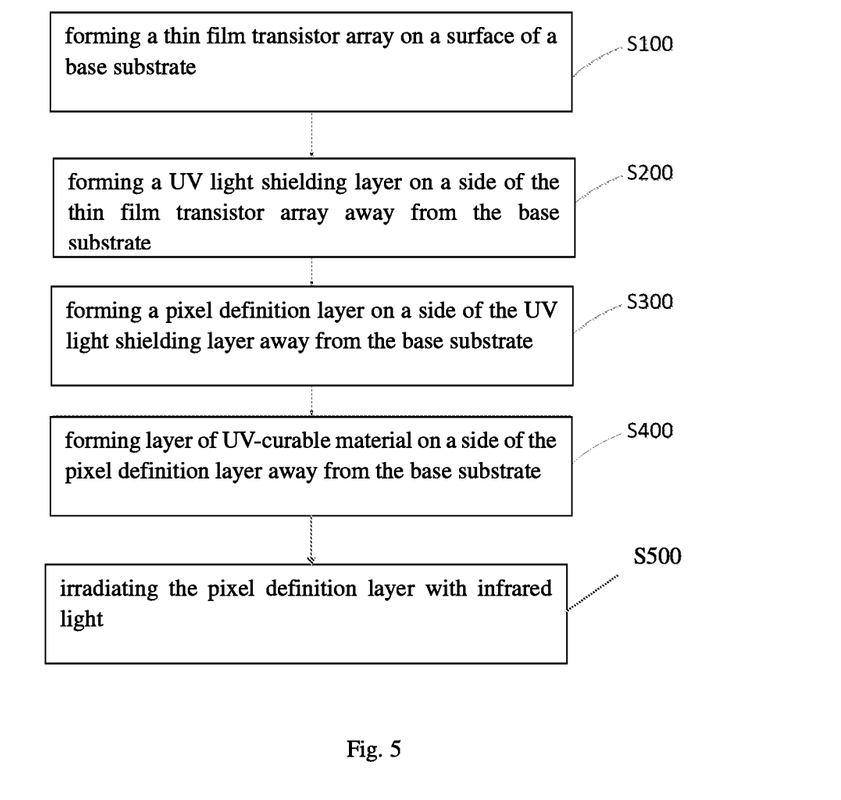
FIG. 5 is a schematic flow chart of producing a display panel in an embodiment of this disclosure.

In another aspect of this disclosure, this disclosure provides a method for producing the display panel mentioned above. According to an embodiment of this disclosure, referring to FIG. 5, the method comprises:

S100: forming a thin film transistor array on a surface of a base substrate.

According to an embodiment of this disclosure, the base substrate and the thin film transistor array are consistent with those described above. No more repeated description is provided here.

According to an embodiment of this disclosure, the method for forming the thin film transistor array (as an example, forming a thin film transistor of the bottom-gate type is used for illustration, which is not understood as limitation to this application) comprises: forming an entire layer of first metal layer on a surface of the base substrate; performing a first patterning treatment to the first metal layer to obtain a gate electrode, wherein the process of the first patterning treatment may comprise but is not limited to wet etching, dry etching, photolithography, or the like; depositing a gate insulating layer on the surface of the base substrate, wherein the gate insulating layer covers the above-mentioned gate electrode, wherein the method for depositing the insulating layer includes but is not limited to CVD, magnetron sputtering, atom layer deposition, or the like; forming a semiconductor layer on a surface of the gate insulating layer away from the base substrate; performing a second patterning treatment to the semiconductor layer, to obtain an active layer, wherein the method of the second patterning treatment may comprise but is not limited to wet etching, dry etching, photolithography, or the like; depositing a second metal layer on a surface of the gate insulating layer away from the base substrate, wherein the second metal layer covers the above-mentioned active layer; performing a third patterning treatment to the second metal layer, to obtain a source electrode and a drain electrode, which cover a part of the active layer, wherein the method of the third patterning treatment may comprise but is not limited to wet etching, dry etching, photolithography, or the like; depositing an insulating layer on a surface of the gate insulating layer away from the base substrate; performing a fourth patterning treatment to the insulating layer, to obtain an interlayered insulating layer, which covers the active layer, source electrode and drain electrode mentioned above, wherein the method of the fourth patterning treatment may comprise but is not limited to wet etching, dry etching, photolithography, or the like; depositing a planarization layer on a surface of the interlayered insulating layer away from the base substrate, wherein the method for depositing the planarization layer includes but is not limited to CVD, magnetron sputtering, atom layer deposition, or the like. Thus, the method for producing the thin film transistor is simple and convenient, and easy to be achieved. Further, a thin film transistor with better performance may be obtained.

S200: forming a UV light shielding layer on a side of the thin film transistor array away from the base substrate.

According to an embodiment of this disclosure, UV light shielding layer is consistent with that described above. No more repeated description is provided here.

According to an embodiment of this disclosure, the method for forming the UV light shielding layer comprises at least one of sputtering, printing, spray coating and atom layer deposition. Thus, the operation is simple and convenient, and easy to be achieved.

In some embodiments of this disclosure, the method for forming the UV light shielding layer specifically comprises: forming an entire layer of a shielding layer on a surface of the thin film transistor array away from the base substrate by means of at least one of sputtering, printing, spray coating and atom layer deposition, and performing a patterning treatment to the shielding layer by etching (for example, wet etching, dry etching, photolithography, or the like), to obtain a UV light shielding layer.

S300: forming a pixel definition layer on a side of the UV light shielding layer away from the base substrate.

Figure 6:
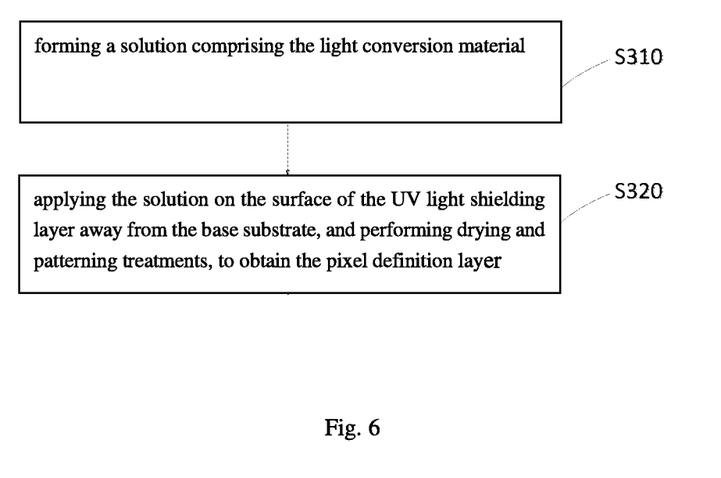
FIG. 6 is a schematic flow chart of producing a pixel definition layer in an embodiment of this disclosure.

According to an embodiment of this disclosure, referring to FIG. 6, forming a pixel definition layer comprises:

S310: forming a solution comprising the light conversion material.

According to an embodiment of this disclosure, the light conversion material is consistent with that described above. No more repeated description is provided here.

According to an embodiment of this disclosure, the material forming the solution with the light conversion material may comprise but is not limited to at least one of polyimide, polymethyl methacrylate, polysiloxane, and organic silicon resin. Thus, the produced pixel definition layer has better insulation effect.

In some embodiments of this disclosure, in order to disperse the light conversion material in the solution uniformly, a dispersant may be added into the solution. The type of the dispersant may be but is not limited to fatty acid-based, aliphatic amide-based or ester-based, or the like. Thus, the operation is simple and convenient, and easy to be achieved. Further, the effect of dispersing the light conversion material is better.

S320: applying the solution on the surface of the UV light shielding layer away from the base substrate, and performing drying and patterning treatments, to obtain the pixel definition layer.

According to an embodiment of this disclosure, pixel definition layer is consistent with that described above. No more repeated description is provided here.

According to an embodiment of this disclosure, the method for applying the solution on the surface of the UV light shielding layer may comprise but is not limited to spin coating, ink jet printing, printing, or the like.

According to an embodiment of this disclosure, performing the patterning treatment comprises: forming a photoresist layer on a surface of the dry layer that formed after the solution is dried away from the base substrate, and exposing the photoresist layer with a mask; developing the exposed photoresist layer, to obtain a pattern in the photoresist layer corresponding to the pixel definition layer; etching the dry layer by an etching method (for example, wet etching, dry etching, or the like), to obtain a pixel definition layer; removing the photoresist layer comprising the pattern. Thus, the operation is simple and convenient, and easy to be achieved. Further, a more precise pixel definition layer may be obtained.

According to an embodiment of this disclosure, the method for producing the display panel further comprises: forming a first electrode in an opening defined by the pixel definition layer, wherein the first electrode and UV light shielding layer are provided at the same level. In some embodiments of this disclosure, the method for forming the first electrode comprises: depositing a first electrode in the opening defined by the pixel definition layer by using the above-mentioned pixel definition layer as a mask. In some other embodiments of this disclosure, the method for forming the first electrode comprises: forming a metal layer on a surface of the thin film transistor array away from the base substrate before forming the pixel definition layer, and performing a patterning treatment to the metal layer, to obtain the first electrode. In this method, the UV light shielding layer may be deposited on the surface of the thin film transistor array that is not covered by the first electrode by using the first electrode as a mask, and then the pixel definition layer is formed on a surface of the UV light shielding layer away from the base substrate. Thus, the operation is simple and convenient, easy to be achieved, and suitable for industrial production.

According to an embodiment of this disclosure, after forming the first electrode, the method further comprises: forming a light-emitting layer on a surface of the first electrode away from the base substrate by a process, such as vapor deposition, printing (for example, including but not limited to ink jet printing, or the like), printing (for example, including but not limited to screen printing, or the like), or the like; forming a second electrode on a surface of the light-emitting layer away from the base substrate by a process, such as vapor deposition, printing (for example, including but not limited to ink jet printing, or the like), printing (for example, including but not limited to screen printing, or the like), or the like. It should be indicated that the second electrode may cover a part of the pixel definition layer. Thus, the function of luminescence may be achieved effectively.

According to an embodiment of this disclosure, the first electrode, the second electrode and the light-emitting layer are consistent with those described above. No more repeated description is provided here.

S400: forming layer of UV-curable material on a side of the pixel definition layer away from the base substrate. Examples of UV-curable material include UV-curable material available for organic thin film encapsulation.

S500: irradiating the pixel definition layer with infrared light, so that the light conversion material in the pixel definition layer emits UV light, which irradiates and cures the layer of UV-curable material, to form the UV-cured material in the thin film encapsulation layer.

According to an embodiment of this disclosure, thin film encapsulation layer is consistent with that described above. No more repeated description is provided here.

According to an embodiment of this disclosure, the forming the pixel definition layer comprises: forming a first inorganic encapsulation layer on a surface of the pixel definition layer away from the base substrate, forming an organic encapsulation layer on a surface of the first inorganic encapsulation layer away from the base substrate, and forming a second inorganic encapsulation layer on a surface of the organic encapsulation layer away from the base substrate, and the like. The layer number of the organic encapsulation layer and the inorganic encapsulation layer may be selected according to practical requirement. Further, the organic encapsulation layer and the inorganic encapsulation layer are set alternatively. Thus, the effect of encapsulation is better, and the effect of blocking oxygen and blocking moisture is better, which results in a better use performance of the display panel.

According to an embodiment of this disclosure, the method for forming the organic encapsulation layer may comprise: forming a coating on a surface of the inorganic encapsulation layer by using at least one of spray coating, ink jet printing, and printing; irradiating the pixel definition layer with infrared light, so that the light conversion material in the pixel definition layer emits UV light by excitation by the infrared light, to form an organic encapsulation layer by curing the coating. The method for forming the inorganic encapsulation layer may comprise but is not limited to at least one of chemical vapor deposition (CVD), sputtering, and atom layer deposition (ALD). Thus, it is convenient and simple to be operated and easy to be achieved.

According to an embodiment of this disclosure, the above-mentioned method for producing the display panel is simple and convenient to be operated, has relatively low costs, and is suitable for industrial production. Further, the produced display panel has all characteristics and advantages mentioned above. No more repeated description is provided here.

The specific flow of the production of the display panel of the present application will be described in details below. It should be indicated that the description below is only used to illustrate the present application, but should not be understood as restriction to the present application.

A thin film transistor (TFT) is formed on a surface of a base substrate. A first electrode having a thickness of 150 nm is produced in a light-emitting area on a surface of the TFT array away from the base substrate by a mask. ZnO having a thickness of 0.5 μm as a UV light shielding layer is formed at a position corresponding to the pixel definition layer on a surface of the TFT array away from the base substrate by means of sputtering. A pixel definition layer is formed on a surface of the UV light shielding layer away from the base substrate by means of a photolithography process. The pixel definition layer comprises $\beta$-NaYF$_4$:Yb$^{3+}$,Tm$^{3+}$/CdSe particles. In an opening defined by the pixel definition layer, a light-emitting layer and second electrode are produced in this order. The second electrode covers the pixel definition layer. A first inorganic encapsulation layer containing SiNx having a thickness of 0.5 μm covering the second electrode is formed. An organic encapsulation layer is printed on the first inorganic encapsulation layer. Then the organic encapsulation layer is irradiated with an infrared laser, so that the particles emit UV light, which cure the organic encapsulation material surround the particles. A second inorganic encapsulation layer containing SiNx having a thickness of 1 μm is produced on the organic encapsulation layer by a CVD process, to obtain the display panel.

In another aspect of this disclosure, this disclosure provides a display device comprising the above-mentioned display panel. The inventor found that this display device has a simple structure, is easy to be produced, has low costs, has a high yield, and exhibits relatively high display quality.

According to an embodiment of this disclosure, the types of display device may be OLED display devices or QLED (quantum point light-emitting diode) display devices. Specifically, the above-mentioned display devices may include, but are not limited to, cell phones, computers, televisions, wearable watches, flat panel displays, and the like. The structure of an above-mentioned display device may also have, in addition to the panel mentioned above, other structures that should be possessed by a conventional display device, such as a color filter substrate, a CPU, an encapsulation structure, and the like.

According to an embodiment of this disclosure, in a general display panel, the manner of encapsulating the display panel is typically using UV light to irradiate and cure the thin film encapsulation structure. The intensity and luminous flux of the UV light that arrives at the thin film transistor by scattering or transmitting is relatively great. This will influences the performance of the active layer, and will further result in excursion of the electron mobility of the thin film transistor, which greatly influences the performance of the display panel in use. However, in the present application, the light conversion material that can absorb infrared light and emit UV light is added in the pixel definition layer, and the UV light shielding layer is produced between the thin film transistor array and the pixel definition layer. The pixel definition layer comprising the light conversion material may emit light as a point light source, which may control the range of the irradiation by UV light. The amount of the light to the thin film transistor by scattering and transmitting is less, and the luminous flux is less. This greatly restricts the exposure on the thin film transistor, reduces the damage to the thin film transistor. Thus, it is hardly to result in the problem of excursion of the electron mobility of the thin film transistor. The yield of the product will be increased, the costs will be reduced Additionally, the terms "first" and "second" are merely used for the purpose of illustration, and cannot be understood as showing or implying relative importance or impliedly indicating the number of the described technical feature. Thus, the feature defined by "first" or "second" may clearly or impliedly includes one or many such features. In the description of this disclosure, "plurality" means two or more, unless there is other clear and specific limitation.

In the description of this specification, the description related to a term, such as "an example", "examples", "an embodiment", "a specific embodiment", or "some embodiments" means that the specific feature, structure, material or character described in that example or embodiment is included in at least one example or embodiment of this disclosure. In this specification, the illustrative expression by the above-mentioned terms is not necessary relates to the same example or embodiment. Further, the specific feature, structure, material or character described may be combined in any one or more examples or embodiments in a suitable manner. Additionally, in the case that there is no conflict, a person skilled in the art may bind or combine different examples or embodiments described in this specification with features in different examples or embodiments.

Although examples of this disclosure have been shown and described, it should be understood that the examples above mentioned are illustrative, and cannot be understood as restriction to this disclosure. A person skilled in the art may change, amend, alternate and modify the examples mentioned above in the scope of this disclosure.

What is claimed is:

1. A display panel, comprising:
    a base substrate;
    a thin film transistor array, which is on a surface of the base substrate;
    a UV light shielding layer, which is on a side of the thin film transistor array away from the base substrate;
    a pixel definition layer, which is on a side of the UV light shielding layer away from the base substrate; and
    a thin film encapsulation layer, which is on a side of the pixel definition layer away from the base substrate,
    wherein the pixel definition layer comprises a light conversion material, which emits UV light by excitation of infrared light, and the thin film encapsulation layer comprises a UV-cured material.
2. The display panel according to claim 1, wherein material forming the UV light shielding layer comprises at least one of zinc oxide, zinc sulfide or titanium dioxide.
3. The display panel according to claim 1, wherein the UV light shielding layer has a thickness of 0.03 to 0.5 μm.
4. The display panel according to claim 1, further comprising: a plurality of pixels defined by the pixel definition layer;
    wherein the UV light shielding layer is between pixel electrodes on a side of the plurality of pixels close to the base substrate.
5. The display panel according to claim 1, wherein an orthogonal projection of the UV light shielding layer on the base substrate covers an orthogonal projection of the pixel definition layer on the base substrate.
6. The display panel according to claim 1, wherein the light conversion material comprises at least one of an oxide doped with rare-earth ions, a fluoride doped with rare-earth ions, an oxyfluoride doped with rare-earth ions, a sulfide doped with rare-earth ions, or a halide doped with rare-earth ions.
7. The display panel according to claim 6, wherein the light conversion material comprises at least one of β-NaYF4:$Yb^{3+}$,$Tm^{3+}$/CdSe, β-NaYF4:$Ln^{3+}$ or β-NaYF4:$Yb^{3+}$,$Er^{3+}$.
8. The display panel according to claim 1, wherein the light conversion material is a particle.
9. The display panel according to claim 8, wherein the particle has a particle size of 5 to 20 nm.
10. The display panel according to claim 1, wherein an amount of the light conversion material in the pixel definition layer is 5 to 30 wt. %.
11. A method for producing the display panel according to claim 1, comprising:
    forming the thin film transistor array on a surface of the base substrate;
    forming the UV light shielding layer on a side of the thin film transistor array away from the base substrate;
    forming the pixel definition layer on a side of the UV light shielding layer away from the base substrate;
    forming a layer of UV-curable material on a side of the pixel definition layer away from the base substrate;
    irradiating the pixel definition layer with infrared light, so that the light conversion material in the pixel definition layer emits UV light, which irradiates and cures the layer of UV-curable material, to form the UV-cured material in the thin film encapsulation layer.
12. The method according to claim 11, wherein the forming the pixel definition layer comprises:
    forming a solution comprising the light conversion material;
    applying the solution on a surface of the UV light shielding layer away from the base substrate, and performing drying and patterning treatments, to obtain the pixel definition layer.
13. The method according to claim 11, wherein a process for forming the UV light shielding layer comprising at least one of sputtering, printing, spray coating or atom layer deposition.
14. A display device, comprising the display panel according to claim 1.

* * * * *